(12) United States Patent
Mistry et al.

(10) Patent No.: US 11,668,738 B2
(45) Date of Patent: Jun. 6, 2023

(54) METHOD AND APPARATUS FOR DETECTING A LOAD

(71) Applicant: Cirrus Logic International Semiconductor Ltd., Edinburgh (GB)

(72) Inventors: Mehul Mistry, Newbury (GB); Rupesh Khare, Newbury (GB); Jack Fuller, Newbury (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/354,237

(22) Filed: Jun. 22, 2021

(65) Prior Publication Data

US 2022/0404407 A1 Dec. 22, 2022

(51) Int. Cl.
*G01R 27/26* (2006.01)
*G01R 31/28* (2006.01)
*H04R 29/00* (2006.01)

(52) U.S. Cl.
CPC ..... *G01R 27/2605* (2013.01); *G01R 31/2825* (2013.01); *H04R 29/001* (2013.01)

(58) Field of Classification Search
CPC ............ G01R 27/2605; G01R 31/2825; H04R 29/001
See application file for complete search history.

(56) References Cited

U.S. PATENT DOCUMENTS

| | | | |
|---|---|---|---|
| 4,383,246 A * | 5/1983 | Munt | H03M 1/52 341/167 |
| 5,146,412 A | 9/1992 | Jones | |
| 5,563,487 A * | 10/1996 | Davis | H02P 25/08 318/400.13 |
| 6,130,541 A | 10/2000 | Ozguc | |
| 6,404,376 B1 * | 6/2002 | Kalthoff | H03M 1/0643 341/172 |
| 7,446,689 B1 * | 11/2008 | Wong | H03M 1/0607 341/120 |
| 9,100,757 B2 * | 8/2015 | Johnson | H04R 29/001 |
| 9,214,950 B1 * | 12/2015 | Davis | H03M 1/0621 |
| 10,845,397 B2 * | 11/2020 | Bruhn, Jr. | H05B 47/10 |
| 2001/0046304 A1 * | 11/2001 | Rast | H04R 1/1083 381/26 |
| 2005/0057315 A1 * | 3/2005 | Groen | H03L 7/0995 331/57 |

(Continued)

FOREIGN PATENT DOCUMENTS

| | | | |
|---|---|---|---|
| CN | 106162485 A | 11/2016 | |
| CN | 112986691 A * | 6/2021 | ............. G01L 1/144 |

(Continued)

OTHER PUBLICATIONS

Olijaca et al. "PGA900 as a Capacitive Load Driver", Texas Instruments Application Report, SLDA020—Mar. 2015 (Year: 2015).*

(Continued)

*Primary Examiner* — Alexander Satanovsky
*Assistant Examiner* — Asm Fakhruddin
(74) *Attorney, Agent, or Firm* — Jackson Walker L.L.P.

(57) ABSTRACT

Circuitry for detecting a capacitive load coupled between a first node and a second node, the circuitry comprising: drive circuitry for applying a first voltage to a first node over a first time period; processing circuitry configured to: measure a second voltage at the first node; and determine that the load is a capacitive load based on the second voltage.

24 Claims, 13 Drawing Sheets

(56) References Cited

U.S. PATENT DOCUMENTS

| | | | |
|---|---|---|---|
| 2010/0315097 A1* | 12/2010 | Lesso | H03F 1/0244 |
| | | | 324/600 |
| 2013/0154579 A1* | 6/2013 | Morita | H02J 7/007194 |
| | | | 320/166 |
| 2013/0187631 A1* | 7/2013 | Russell | G01R 19/175 |
| | | | 324/76.77 |
| 2017/0179760 A1* | 6/2017 | Jawany | B60L 1/20 |
| 2017/0196071 A1* | 7/2017 | Gim | H05B 47/16 |
| 2018/0113159 A1 | 4/2018 | Nastase et al. | |
| 2019/0235008 A1* | 8/2019 | Yates | G06F 1/26 |
| 2021/0126542 A1* | 4/2021 | Jeong | H02J 7/02 |

FOREIGN PATENT DOCUMENTS

| | | | | |
|---|---|---|---|---|
| EP | 3215859 A1 * | 9/2017 | | G01R 31/003 |
| JP | H05206817 A * | 5/1993 | | H02P 25/08 |

OTHER PUBLICATIONS

Harsha Munikoti, "Closed-Loop Analysis of Load-Induced Amplifier Stability Issues Using ZOUT", Texas Instruments Application Report, SLYA029—Oct. 2017 (Year: 2017).*
Search Report under Section 17, UKIPO, Application No. GB2204474.7, dated Sep. 21, 2022.

* cited by examiner

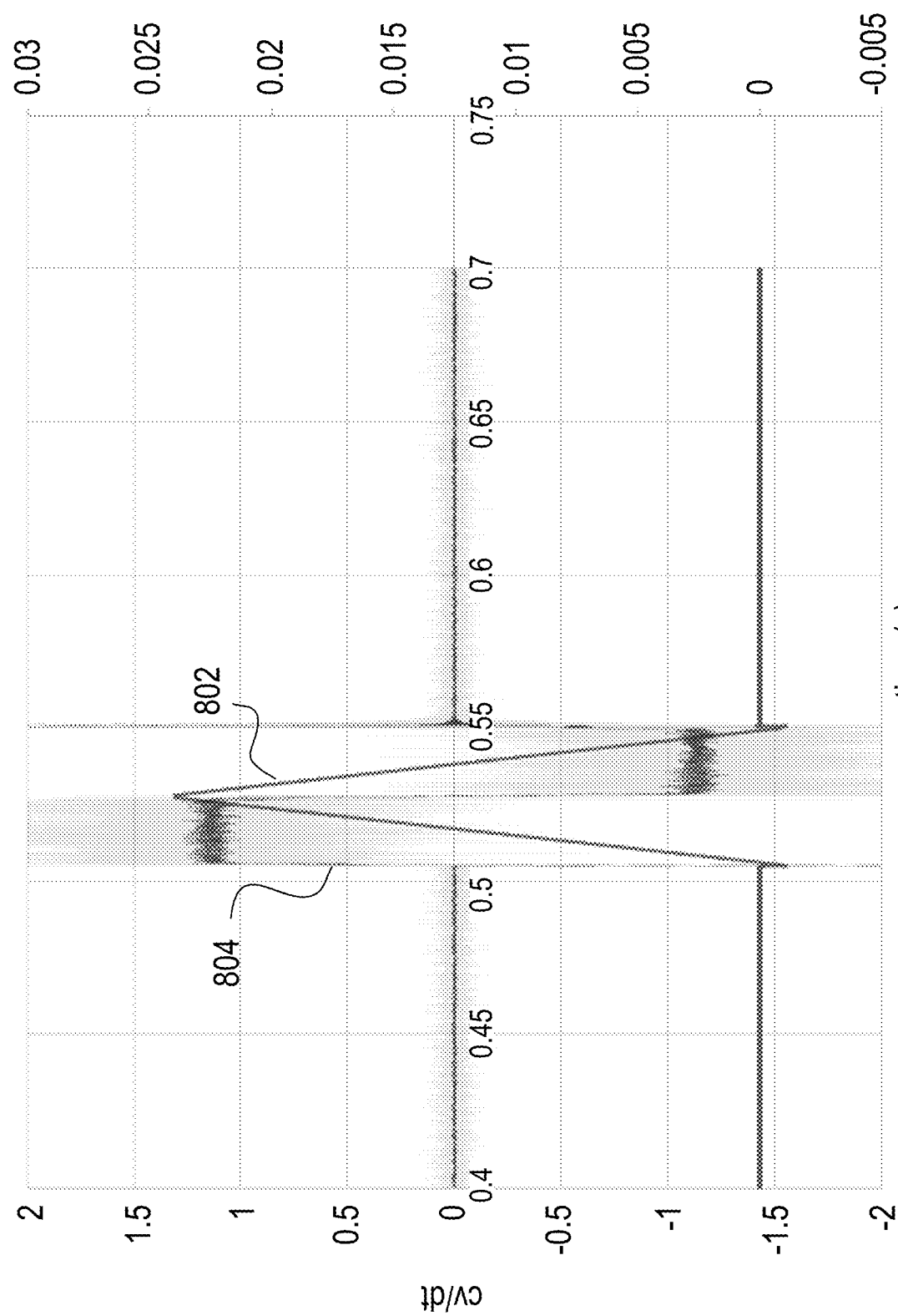

METHOD AND APPARATUS FOR DETECTING A LOAD

TECHNICAL FIELD

The present disclosure relates to the methods and apparatus for detecting the presence and properties of connected loads.

BACKGROUND

For many applications, it is desirable to have knowledge of the ohmic and capacitive properties of connected loads. For example, where a headphone or other external audio device is connected to a host device via a headphone jack or similar connection, knowledge of the impedance of the headphone can be used to tailor processing of signals output to the headphone.

Conventional load detection circuits measure impedance of a connected load by supplying a current to a connected load and comparing the ohmic impedance of the connected load to one or more internal resistors in the detection circuit. After a current has been supplied to the connected load, it is common to short the connections to the load, to discharge any residual current, via a clamp or short circuit. However, when the connected load has a capacitance, discharge of the load's capacitance via the clamp can cause detrimental circuit effects to the load, the detection circuit or both. When the connected load is a headphone, the discharge of the capacitance can lead to an audible artefact output from the speaker of the headphone.

SUMMARY

According to a first aspect of the disclosure, there is provided circuitry for detecting a capacitive load coupled between a first node and a second node, the circuitry comprising: drive circuitry for applying a first voltage to a first node over a first time period; processing circuitry configured to: measure a second voltage at the first node; and determine that the load is a capacitive load based on the second voltage.

The processing circuitry may be configured to: after the first time period, measure the second voltage by comparing the second voltage to a first reference voltage; and determine that the load is the capacitive load if the second voltage is greater than a first reference voltage.

The processing circuitry may be configured to: determine that second voltage is lower than the first reference voltage; determine a time delay between the end of the first time period and the determining that the second voltage is lower than the first reference voltage; and determine a capacitance of the load based on the time delay.

The processing circuitry may be configured to: determine that the load is the capacitive load if the second voltage exceeds a peak amplitude of the first voltage.

The processing circuitry may be configured to: measure a change in the second voltage; and determine that the load is the capacitive load based on the measured change in the second voltage.

The drive circuitry may be configured to ramp up the first voltage during the first time period. The change in the second voltage may be measured during the first time period.

The drive circuitry may be configured to: ramp up the first voltage during the first time period; and hold the first voltage constant during a second time period.

The processing circuitry may be configured to measure the change in the second voltage during the second time period.

The drive circuitry may be configured to ramp down the first voltage during a third time period after the second time period. The processing circuitry may then be configured to measure the change in the second voltage during the third time period.

The processing circuitry may be configured to: determine that the load is the capacitive load if the measured change in the second voltage is non-linear.

The processing circuitry may be configured to: determine a capacitance of the load based on the measured change in the second voltage.

The processing circuitry may be configured to: determine the capacitance of the load based on a measured rate of change in the second voltage.

The circuitry may further comprise: a first impedance path selectively coupled between the first and second nodes; and a second impedance path selectively coupled between the first and second nodes the second impedance path having a higher impedance than the first impedance path. The processing circuitry may then be configured to: couple the second impedance path between the first and second nodes if it is determined that the load is the capacitive load.

The processing circuitry may be configured to couple the first impedance path between the first and second nodes if it is determined that the load is not the capacitive load.

The circuitry may further comprise a digital-to-analogue converter (DAC), wherein the second impedance path passes through the DAC.

The circuitry may comprise a variable resistance. The second impedance path may pass through the variable resistance.

The processing circuitry may be configured to: control the variable resistance to reduce the resistance of the second impedance path after coupling the second impedance path between the first and second nodes.

The variable resistance may comprise a switchable resistor string.

The first impedance path may comprise a switch.

The capacitive load may comprise an active load. The active load may comprise a headset, such as a noise cancelling headset.

According to another aspect of the disclosure, there is provided an electronic device comprising circuitry described above.

The electronic device may comprise one of a mobile computing device, a laptop computer, a tablet computer, a games console, a remote control device, a home automation controller or a domestic appliance, a toy, a robot, an audio player, a video player, or a mobile telephone, and a smartphone.

According to another aspect of the disclosure, there is provided a non-transitory machine-readable medium storing instructions which, when executed by processing circuitry, cause an electronic apparatus to implement a method comprising: applying a first voltage to the first node over a first time period; measuring a second voltage at the first node; and determining that the load is a capacitive load based on the second voltage.

According to another aspect of the disclosure, there is provided a method of detecting a capacitive load coupled between a first node and a second node, the method comprising: applying a first voltage to the first node over a first time period; measuring a second voltage at the first node; and determining that the load is a capacitive load based on the second voltage.

The method may further comprise, after the first time period, measuring the second voltage by comparing the second voltage to a first reference voltage; and determining that the load is the capacitive load if the second voltage is greater than a first reference voltage.

The method may further comprise determining that the second voltage is lower than the first reference voltage; determining a time delay between the end of the first time period and the determining that the second voltage is lower than the first reference voltage; and determining a capacitance of the load based on the time delay.

The method may further comprise determining that the load is the capacitive load if the second voltage exceeds a peak amplitude of the first voltage.

The method may further comprise measuring a change in the second voltage; and determining that the load is the capacitive load based on the measured change in the second voltage.

The method may comprise ramping up the first voltage during the first time period. The change in the second voltage may be measured during the first time period.

The method may further comprise ramping up the first voltage during the first time period; and holding the first voltage constant during a second time period.

The method may further comprise measuring the change in the second voltage during the second time period.

The method may further comprise ramping down the first voltage during a third time period after the second time period. The method may further comprise measuring the change in the second voltage during the third time period.

The method may further comprise determining that the load is the capacitive load if the measured change in the second voltage is non-linear.

The method may further comprise determining a capacitance of the load based on the measured change in the second voltage.

The method may further comprise determining the capacitance of the load based on a measured rate of change in the second voltage.

The method may further comprise coupling the first impedance path between the first and second nodes if it is determined that the load is not the capacitive load.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which:

FIG. 8A is a graph of voltage at a node of the detection circuit of FIG. 7 over time and rate of change of the same voltage over time (dV/dT) for a resistive load;

DESCRIPTION OF EMBODIMENTS

Figure 1:
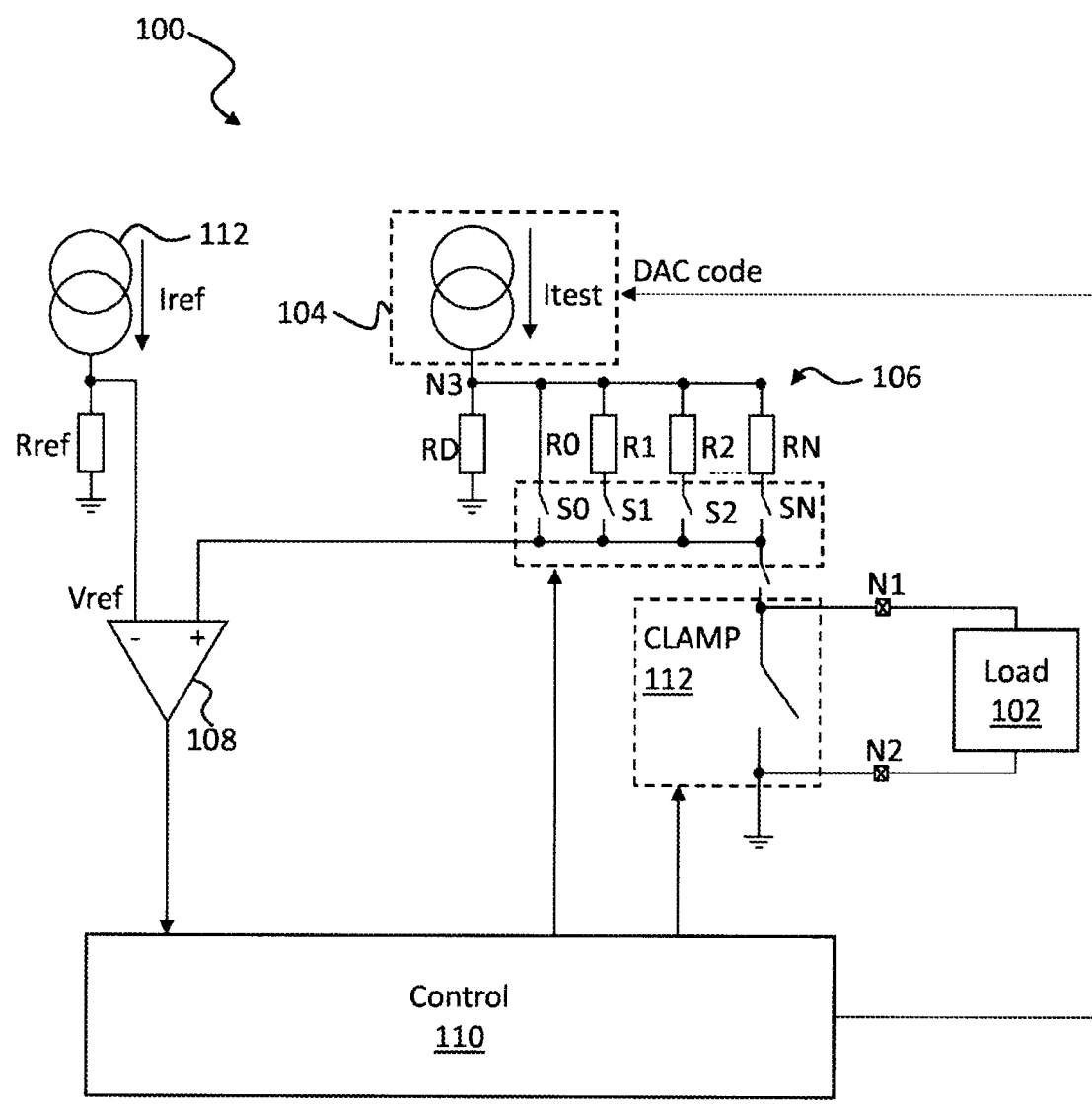
FIG. 1 is a schematic diagram of a load impedance detection circuit.

FIG. 1 is a schematic diagram of a load impedance detection circuit 100 configured to detect an impedance of a load 102 connected between a first node N1 and a second node N2. In some embodiments, the load 102 is a headset. The detection circuit 100 comprises a current digital to analogue converter (DAC) 104, a resistor ladder 106, a comparator 108, a control circuit 110 and a clamp 112.

The DAC 104 comprises current source 109 configured to supply a test current Itest through a supply node N3. The test current Itest supplied by the current source 109 is controllable by the control module 110 by a DAC code supplied to the DAC 104 by the control module 110. A plurality of resistors R1, R2, RN, each having a different impedance, are coupled to the supply node N3. Each of the plurality of resistors R1:RN are selectively connectable by a respective switch S1:SN between the supply node N3 and the first node N1 to which the load 102 under test is connected. The switches S1:SN are also controlled by the control module 110 so as to selectively connect one of the plurality of resistors R1:RN to the supply node N3 and the first node N1 at any time. As such, the impedance of the load 102 can be compared against four impedance ranges as defined by R0, R1, R2 and RN. Whilst in the embodiment shown four resistors R1:RN are provided, it will be appreciated that more or fewer resistors may be provided in other embodiments. A discharge resistor RD is also provided between the supply node N3 and ground to limit audible artefacts associated with measurement of the load 102. The control module also controls the clamp 112 which is provided to selectively discharge a voltage present at the first node N1 after a test cycle, as will be described in more detail below.

The control module 110 is configured to control the switches R0:RN and the DAC 104 over a plurality of test cycles. During each test cycle, the clamp 112 is disabled (opened or disconnected) and the switches S1:SN are controlled by the control module 110 to selectively connect one of the plurality of resistors to the supply node N3 and the first node N1. The current supplied by the DAC 104 to the first node N1 via the connected resistor is then ramped up to a peak current and back down again. During the ramping up and down of the test current Rest, the comparator 108 compares the voltage at the first node N1 with a reference voltage Vref provided by a reference current source 112. When the test current Itest has been ramped back down to zero, the clamp 112 is enabled (closed or connected) and any voltage still present at the first node N1 is discharged to ground. The test cycle is then repeated for each impedance range by selectively connecting a different one of the plurality of resistors R1:RN between the supply node N3 and the first node N1.

During the plurality of test cycles, when the voltage at the first node N2 exceeds the reference voltage Vref, the output of the comparator 108, provided to the control module 110, toggles high and the value of the DAC code provided to the DAC 104 at the time of the toggle can be used to estimate the ohmic impedance of the load 102 connected between the first and second nodes N1, N2. As the voltage at the first node N2 drops back down below the reference voltage Vref, the output of the comparator 108 toggles low. Again, the DAC code at the time at which the output of the comparator 108 toggles low can also be used to estimate the ohmic impedance of the connected load 102.

Figure 2:
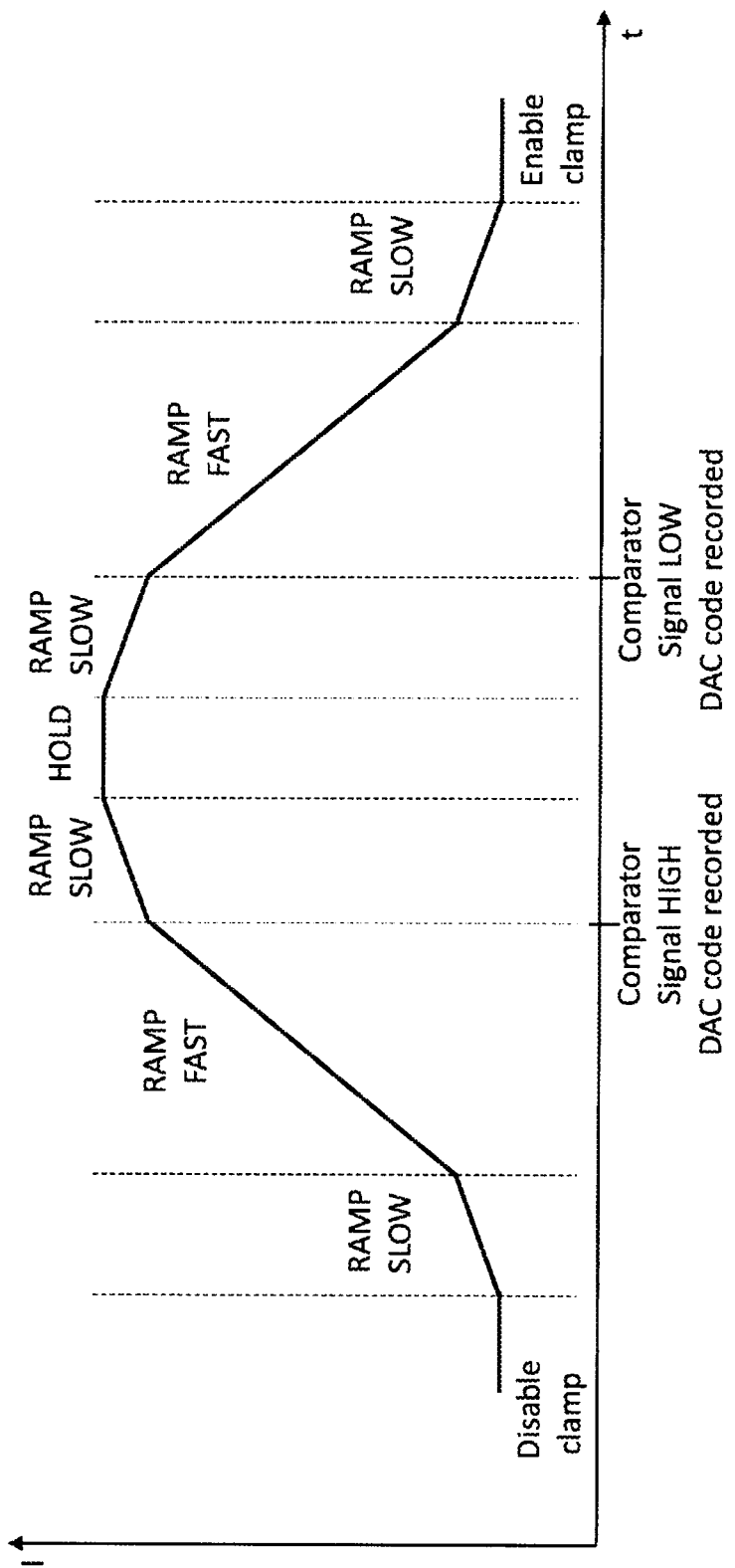
FIG. 2 is a graphical illustration of test current vs time for various phases of a test cycle implemented by the detection circuit of FIG. 1.

FIG. 2 is a graphical illustration of an example test cycle 200 implemented by the detection circuit 100 shown in FIG. 1 during a test cycle 200 in which the impedance of the load 102 is within the range of the resistor of the plurality of resistors R1:RN connected between the supply node N3 and the first node N1.

The clamp 112 is disabled (disconnected) and the DAC code provided to the DAC 104 is increased initially slowly (e.g. every $2^{nd}$ clock cycle) and then fast (e.g. every clock cycle) to increase the current provided to the load 102. When the signal output from the comparator 108 to control module 110 goes high, the DAC code is stored in a register and the DAC code is increased slowly (e.g. every $2^{nd}$ clock cycle) until the maximum DAC code is reached. The test current Itest is then held at this maximum for a wait period before the DAC code is decreased initially slowly (e.g. every $2^{nd}$ clock cycle) until the comparator signal output from the comparator 108 goes low. At this point, the DAC code is stored in a register and the DAC code is decreased fast (e.g. every clock cycle). When the test current Itest approaches zero, the DAC code is decreased slowly (e.g. every $2^{nd}$ clock cycle) until the current Itest provided by the DAC 104 is at a minimum (e.g. zero) and the clamp is enabled (connected) to discharge any residual current to ground.

Several problems exist with the detection circuit 100 and detecting regime described above when the load 102 connected between the first and second nodes N1, N2 is capacitive. Firstly, the above detection method is unable to differentiate a capacitive load from a resistive load or determine a capacitance of the connected load 102. Secondly, when the connected load 102 has a large capacitance, connection of the clamp 112 between the first and second nodes N1, N2 at the end of a test cycle causes an immediate and abrupt discharge of charge stored in the connected capacitive load 102 which can have a detrimental effect to both the load 102 and the detection circuit 100. The latter problem is particularly detrimental when the load 102 comprises a capacitive headset or similar audio device. In such examples, discharge of the capacitive load 102 through the clamp 112 causes an audible artefact (pop) output from the speaker(s) of the headset.

Figure 3:
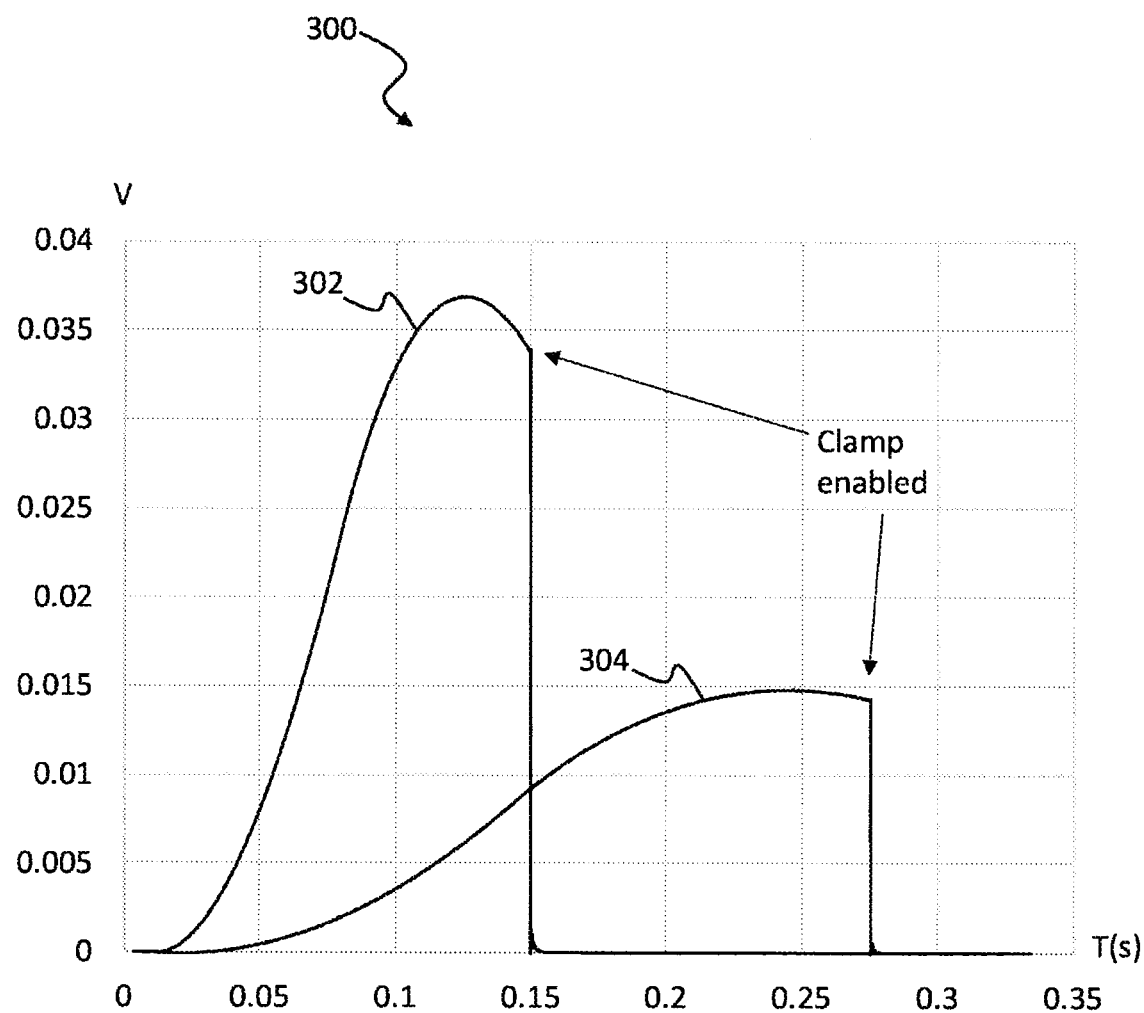
FIG. 3 is a graph of voltage at a node of the detection circuit of FIG. 1 connected to load under test during two different test cycles.

FIG. 3 is a graph 300 of voltage measured between the first and second nodes N1, N2 over time during first and second test cycles 302, 304, each with a different one of the plurality of resistors R1:RN connected between the supply node N3 and the first node N1, in which the clamp 112 is used to discharge the load 102. In each case, at the end of respective test cycles 302, 304, enablement of the clamp causes an immediate discharge of the capacitive load 102 through the clamp 112 which causes an audible artefact when the load 102 is a headset.

Figure 4:
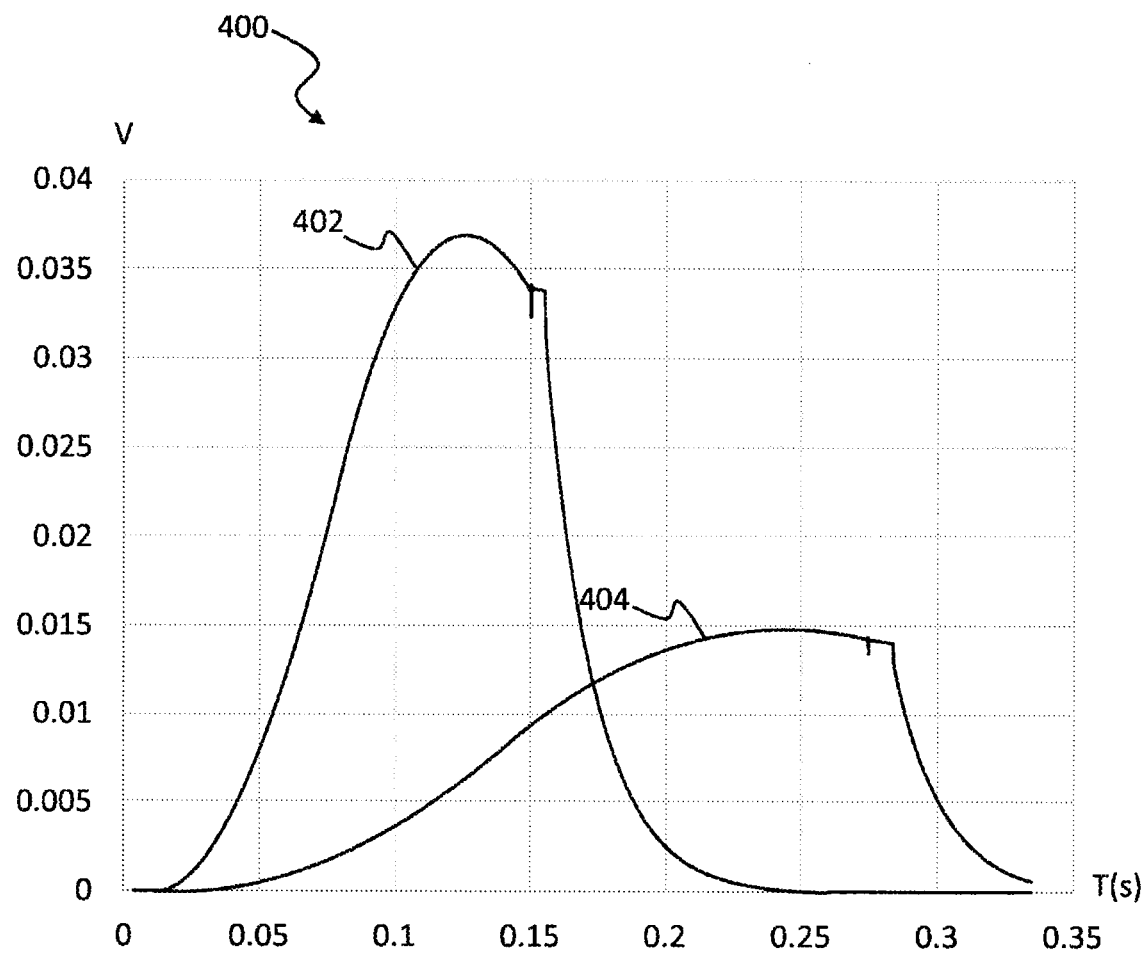
FIG. 4 is a graph of voltage at a node of the detection circuit of FIG. 1 connected to load under test during two different test cycles.

FIG. 4 is a graph 400 of voltage measured between the first and second nodes N1, N2 over time during first and second test cycles 402, 404 in which the clamp 112 is not enabled at the end of the test cycles 402, 404. It can be seen that there is a slow discharge of the capacitive load 102 through the selected one of the plurality of resistors R1:RN and the discharge resistor RD to ground. The rate of discharge is dependent on which of the plurality of resistors R1:RN is switched in as well as the capacitance of the load 102.

Embodiments of the present disclosure aim to address or at least ameliorate one or more of the above problems. Certain embodiments do so by monitoring the voltage provided to a node to which a load is connected to determine whether that load is capacitive. Specifically, with reference to FIG. 1, voltage at the first node N1 may be monitored at the end of a test cycle to determine whether the connected load 102 is capacitive or not. Certain embodiments may, on determination that the load 102 is capacitive, determine an impedance of the load 102 (both ohmic and capacitive). Certain embodiments may, on determination that the load 102 is capacitive, discharge the load 102 in a controlled manner so as to mitigate against artefacts associated with abrupt discharge of current. Exemplary detection circuits for implementing such functionality will now be described.

Figure 5:
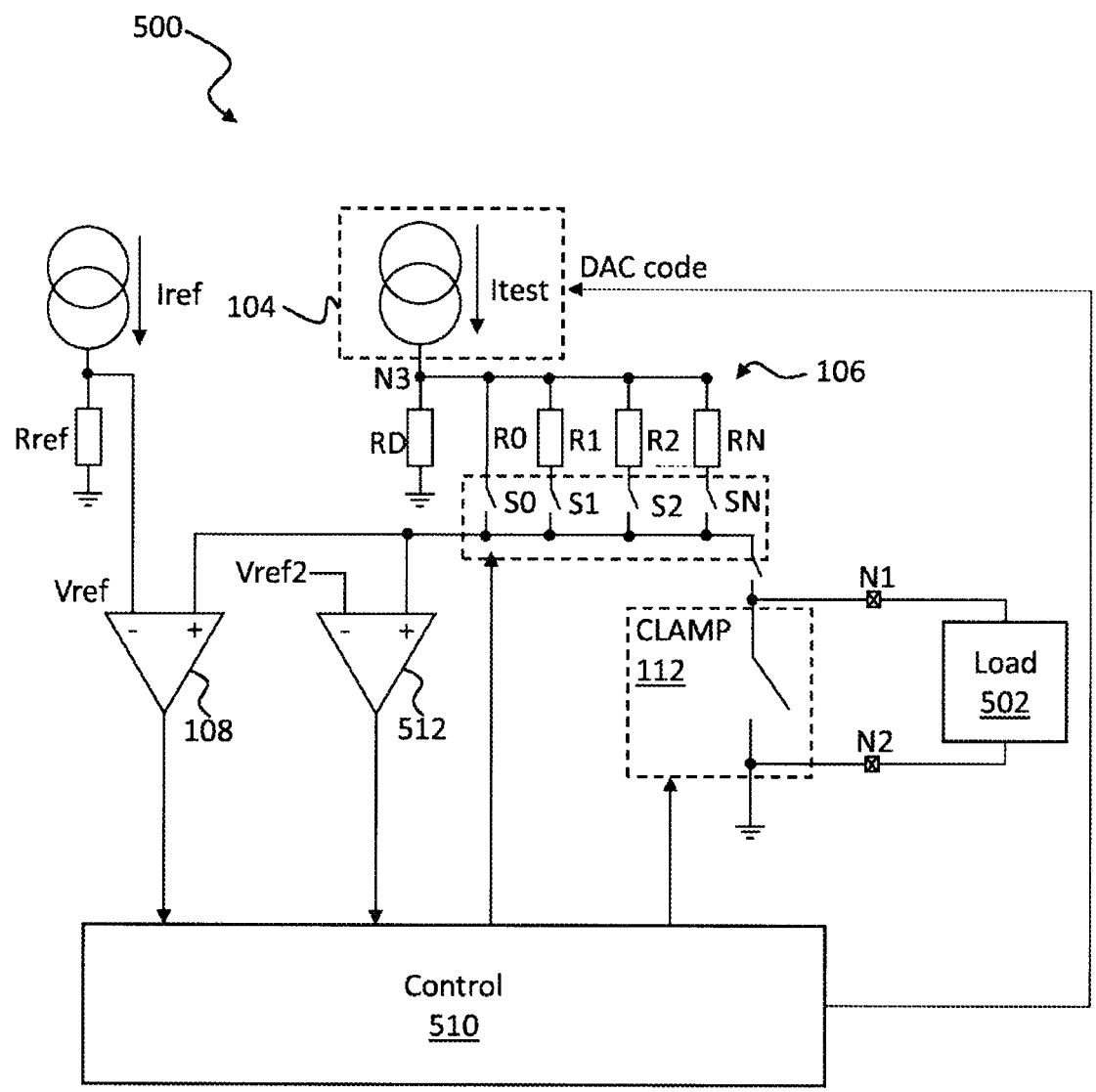
FIG. 5 is a schematic diagram of a load impedance detection circuit according to embodiments of the present disclosure.

FIG. 5 is a schematic diagram of an example load impedance detection circuit 500 according to embodiments of the present disclosure configured to detect an impedance of a load 502 connected between a first node N1 and a second node N2. In some embodiments, the load 502 is a headset. The detection circuit 500 shares some similar features to the detection circuit of FIG. 1 and like parts have been denoted with like numberings in FIG. 5. Specifically, the detection circuit 500 comprises a current digital to analogue converter (DAC) 104, a resistor ladder 106, a comparator 108 and a clamp 112. A control module 510 is also provided to control each of the DAC 104, the resistor ladder 106, and the clamp 112. The control module 510 operates in a similar manner to the control module 110 of the detection circuit 100 of FIG. 1. In addition, the control module 510 has additional functionality which will be described in more detail below.

In contrast to the detection circuit 100 of FIG. 1, the detection circuit 500 of FIG. 5 further comprises a second comparator 512. The second comparator 512 is configured to compare the voltage at the first node N1 with a second reference voltage Vref2. The second reference voltage Vref2 may be provided in any manner known in the art. The output of the comparator 508 is configured to toggle high when the voltage at the first node N1, and therefore the non-inverting input of the comparator 508, transitions from being less than the reference voltage vref2 to exceeding the reference voltage Vref2. The output of the comparator 508 is configured to toggle low when the voltage at the first node N1, and therefore the non-inverting input of the comparator 508, transitions from exceeding the reference voltage vref2 to being less than the reference voltage Vref2.

The detection circuit 500 may be configured to operate a plurality of test cycles in a substantially similar manner to the detection circuit 100 described above with reference to FIGS. 1 and 2. However, in the present example, at the end of each test cycle and before the clamp 112 is enabled, the control module 510 may be configured to monitor the output from the second comparator 512. If, after a predetermined time period after the test current Itest has been reduced to zero, the output at the second comparator 512 is low, then the voltage at the first node N1 is less than the second reference voltage Vref2 and the control module 510 may deduce that the load 502 is a resistive load. However, if after the predetermined time period the output at the second comparator 512 is high, then the voltage at the first node N1 is still greater than the second reference voltage Vref2 and the control module 510 may deduce that the load 502 is capacitive since the capacitance in the load 502 continues to discharge through the connected one of the resistor string 106 and the discharge resistor RD.

To increase the sensitivity of the detection circuit 500 to capacitive loads, the second reference voltage Vref2, and therefore the threshold of the comparator 512, may be chosen to be low, whilst being high enough to prevent a false detection of a capacitive load when the load 502 is substantially purely resistive.

Figure 6:
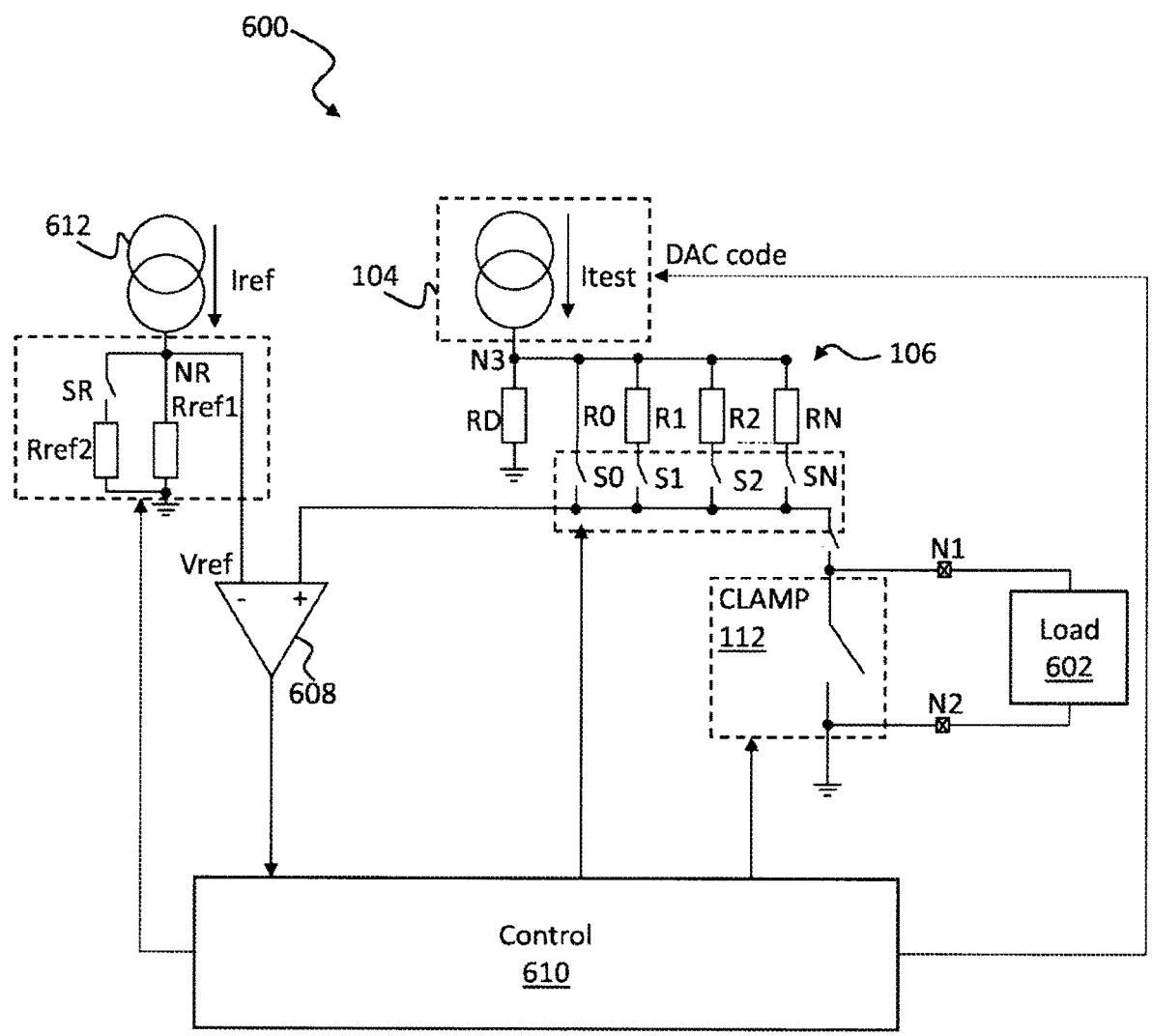
FIG. 6 is a schematic diagram of a load impedance detection circuit according to embodiments of the present disclosure.

FIG. 6 is a schematic diagram of an example load impedance detection circuit 600 according to embodiments of the present disclosure configured to detect an impedance of a load 602 connected between a first node N1 and a second node N2. In some embodiments, the load 602 is a headset. The detection circuit 600 of FIG. 6 is similar to the detection circuit 500 of FIG. 5 and like parts have been given like numbering.

In contrast to the detection circuit 500 of FIG. 5 which is provided with the second comparator 512, the detection circuit 600 of FIG. 6 comprises a single comparator 608 whose output is provided to a control module 610. The comparator 608 is provided with a variable reference voltage Vref and thus a variable threshold. In this embodiment, the variable reference voltage Vref is generated by a current source 612 configured to provide a reference current Iref to a reference node NR. The reference node NR is connected to the inverting input of the comparator 608. The reference node NR is also coupled to ground via a first resistor Rref1. A second resistor Rref2 is switchably connected in parallel to the first resistor Rref2 by a reference switch SR controlled by the control module 610.

The detection circuit 600 may be configured to operate a plurality of test cycles in a substantially similar manner to the detection circuit 100 described above with reference to FIGS. 1 and 2. However, in some embodiments, during the test cycle, the control module 610 may operate the comparator 608 in a first mode in which the second resistor Rref2 is disconnected (the reference switch open). At the end of each test cycle and before the clamp 112 is enabled, the control module 610 may be configured to connect the second resistor Rref2, thereby reducing the reference voltage Vref provided to the comparator 608. The control module 610 may then monitor the output of the comparator 608 in a similar manner to the control module 510 described above to determine whether the load 602 is a capacitive load or a substantially purely resistive load.

In the embodiment shown in FIG. 6, the reference voltage Vref is generated by the combination of the first and second resistors Rref1, Rref2 and the current source 612. It will be appreciated that any other known scheme may be used to control and apply the reference voltage to the comparator 608.

Figure 7:
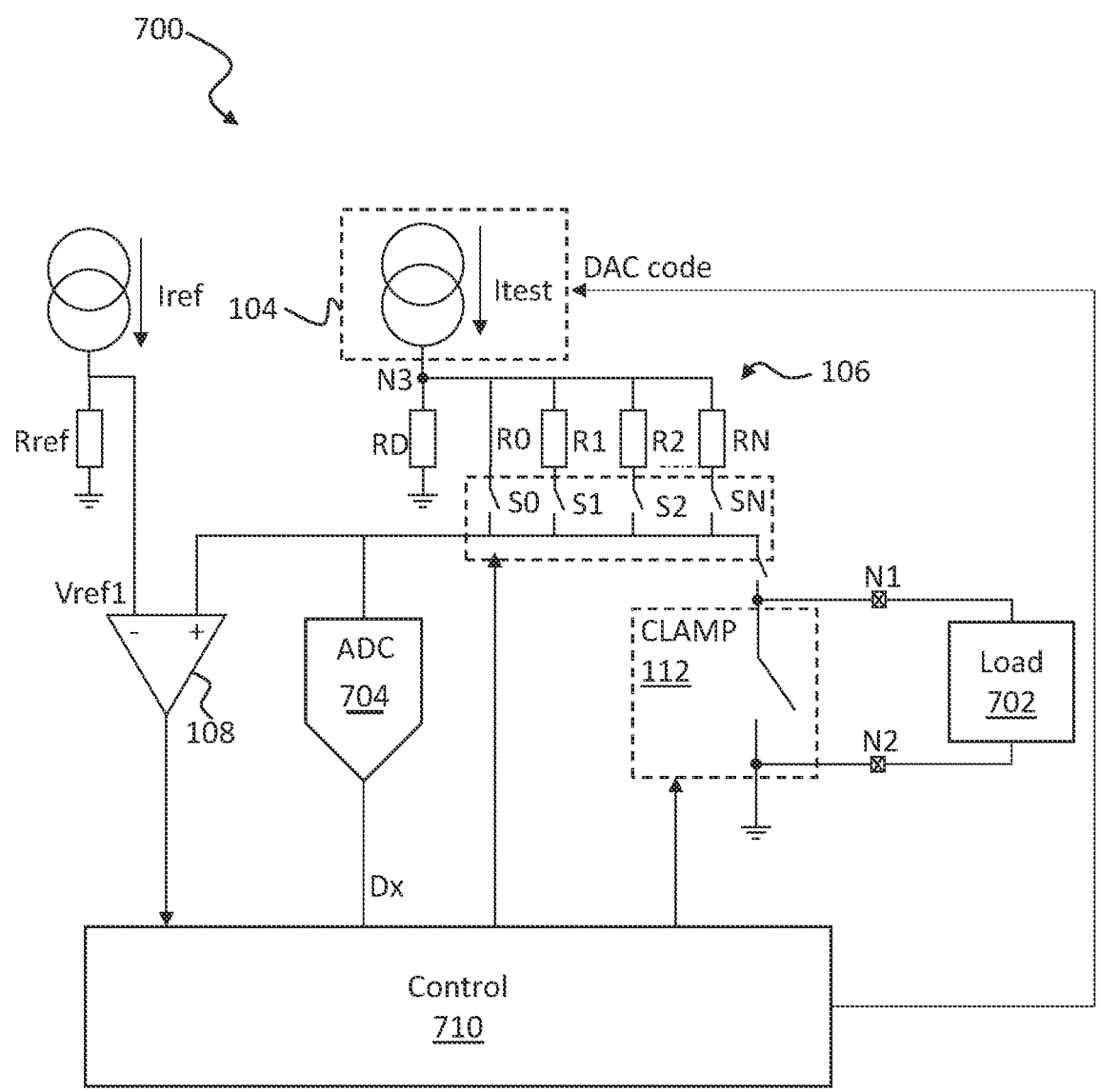
FIG. 7 is a schematic diagram of a load impedance detection circuit according to embodiments of the present disclosure.

FIG. 7 is a schematic diagram of a load impedance detection circuit 700 according to embodiments of the present disclosure which is a further variation of the detection circuit 500 shown in FIG. 5. Instead of providing the second comparator 512, the detection circuit 700 is provided with an analogue-to-digital converter (ADC) 704 configured to sample the voltage at the first node N1 and provide a digital representation Dx of the sampled voltage to a control module 710.

The detection circuit 700 may be configured to operate a plurality of test cycles in a substantially similar manner to the detection circuit 100 described above with reference to FIGS. 1 and 2. However, in the present example, at the end of each test cycle and before the clamp 112 is enabled, the control module 610 may be configured to monitor the digital representation Dx of the voltage at the first node N1. If, after a predetermined time period after the test current Itest has been reduced to zero, the voltage at the first node is below a threshold, the control module 710 may deduce that the load 702 is a resistive load. However, if after the predetermined time period the voltage at the first node N1 is above the threshold, the control module 710 may deduce that the load 702 is capacitive.

As discussed above, the detection circuits 500, 600, 700 described above may all be configured to monitor the voltage at the first node N1 after each test cycle. Additionally or alternatively, however, the detection circuits 500, 600, 700 may monitor the voltage at the first node N1 during the test cycle as will be described in the following examples.

Referring again to FIG. 2, in each test cycle, the test current Itest applied to the respective loads 502, 602, 702 is ramped from zero to a peak current and back down to zero. When the test current Itest reaches its peak, the DAC code is held during a wait time before ramping down of the test current Itest to zero. The inventors have realised that by monitoring or observing the voltage at the first node N1 during this wait time, a determination can be made as to whether the respective load 502, 602, 702 is resistive or capacitive. Specifically, when the respective load 502, 602, 702 is a capacitive load, after the test current Itest reaches its peak current, the voltage at the first node N1 will continue to increase due to the capacitance of the load 502, 602, 702. In contrast, when the respective load 502, 602, 702 is a resistive load, after the test current Itest reaches its peak current, the voltage at the first node N1 will not increase.

Figure 8B:
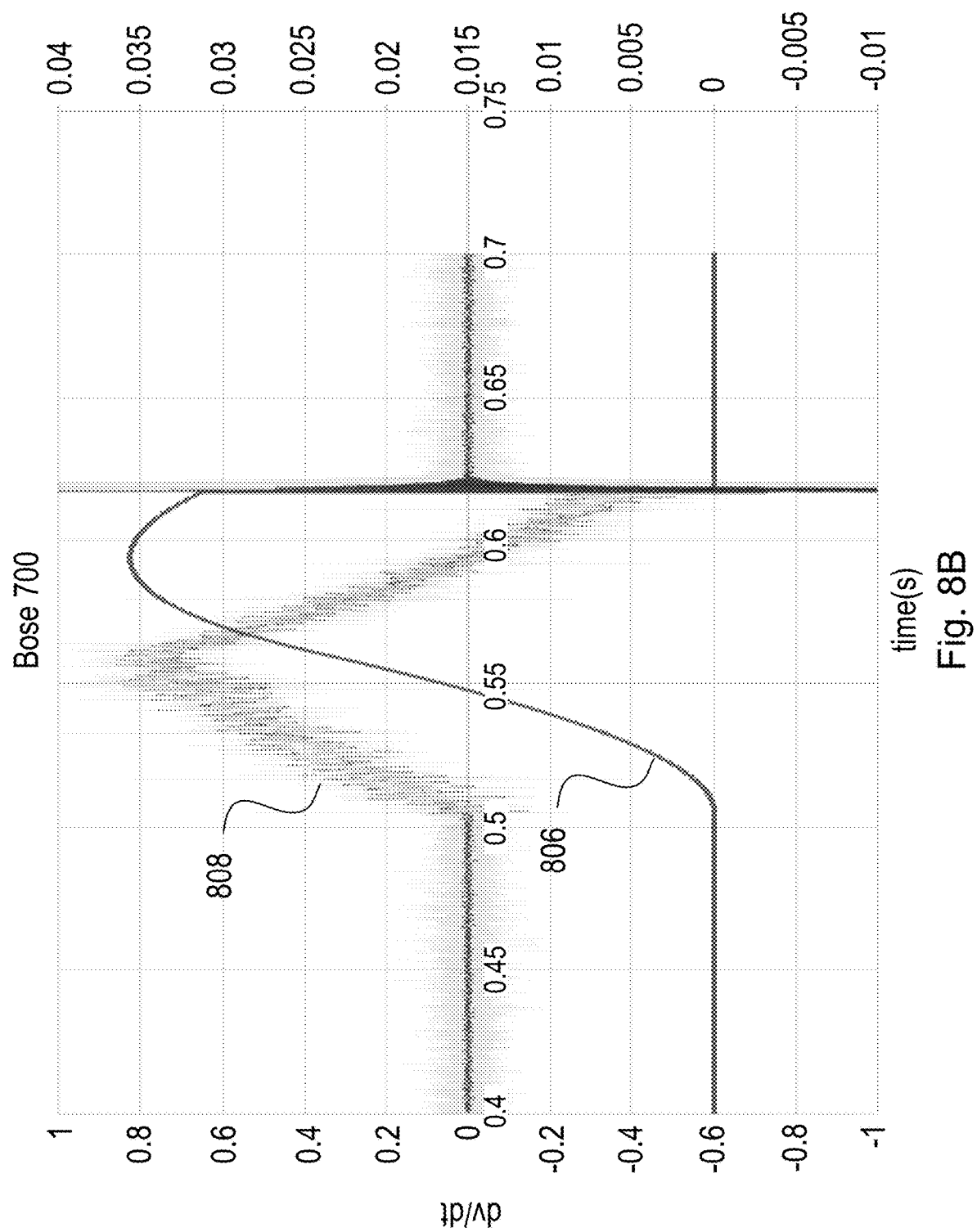
FIG. 8B is a graph of voltage at a node of the detection circuit of FIG. 7 over time and rate of change of the same voltage over time (dV/dT) for a capacitive load.

FIGS. 8A and 8B graphically illustrate measured voltage over time at the first node N1 for a resistive load (FIG. 8A) and a capacitive load (FIG. 8B) measured under the same test cycle conditions with the same test current Itest profile applied to the first node N1. FIG. 8A shows the measured voltage 802 at the first node N1 with a resistive load connected between the first and second nodes N1, N2 of the detection circuit 100 and the derivative dV/dT 804 of the measured voltage 802. FIG. 8B shows the measured voltage 806 at the first node N1 with a capacitive load connected between the first and second nodes N1, N2 of the detection circuit 100 and the derivative dV/dT 808 of the measured voltage 806.

Comparing FIGS. 8A and 8B it can be seen that the measured voltage 802 at the first node N1 (resistive load) peaks at less than 25 mV whereas the measured voltage 806 at the first node N1 (capacitive load) peaks at over 35 mV.

As such, the detection circuits 500, 600, 700 may be configured to determine, during the time at which the test current Itest reaches a peak current, the voltage at the first node N1 to determine whether the respective load 502, 602, 702 is resistive or capacitive.

For example, the detection circuit 500 may be provided with a variable second voltage Vref2. During the hold period in the test cycle, the second voltage Vref2 may be set to a voltage configured to toggle the second comparator 512 if the voltage at the first node N1 exceeds that associated with a resistive load. In the example shown in FIGS. 8A and 8B, for example, the second voltage Vref2 may be set to 25 mV. Then, if the voltage at the first node N1 exceeds 25 mV, the comparator 512 output will go high and the control module 510 may determine that the load 502 is a capacitive load. Otherwise, the control module 510 may determine that the load 502 is a resistive load.

Likewise, variable reference voltage Vref provided to the comparator 608 of the detection circuit 600 may be set similarly during the hold period in the test cycle so as to trigger if the voltage at the first node N1 exceeds a threshold associated with a resistive load.

The detection circuit 700 may equally be configured to sample the voltage at the first node N1 during the hold period and provide the digital representation of that voltage to the control module 710 which may then determine whether the load 702 is capacitive or resistive based on the sampled voltage Dx.

It will also be appreciated that during the hold period between the ramp up and ramp down of current in each test cycle, the test current Itest supplied to the load 702 will be constant. As such, the voltage at the first node N1 will also be constant for a purely resistive load. In contrast, the voltage at the first node N1 will increase during the hold period for a capacitive load which will continue to charge up during the hold period. This difference in behaviour of the voltage at the first node N1 may be monitored using the ADC 704 of the detection circuit 700. In some embodiments, the ADC 704 may sample the first node N1 voltage at two time-separated moments during the hold period (e.g. the start and the end). The control module 710 may then compare the voltage samples to determine whether the load 702 is resistive or capacitive. For example, the control module 710 may determine that the load 702 is a resistive load if the voltage samples are the same and may determine that the load 702 is a capacitive load if the voltage samples are different (e.g. the second voltage sample is greater than the first voltage sample).

It will be appreciated that novel features of the detection circuits 500, 600, 700 may be combined to increase the robustness of any determination as to whether a load is resistive or capacitive. For example, in a variation, the comparator 512 of the detection circuit 500 may be implemented in addition to the ADC 704. In which case, a determination may be made as to whether a load is resistive or capacitive based on the output of the comparator 512 (as described above) or by comparing voltages sampled by the DAC 104 (also as described above).

In some embodiments, the control module 710 may determine a rate of change of the voltage at the first node N1, for example by sampling the voltage at the first node N1 using the ADC 704. The rate of change may be determined during the ramp up of the test current Itest, the ramp down of the test current Itest, or both.

For a resistive load, the rate of change of the voltage at the first node N1 will be substantially constant (as shown, for example, in FIG. 8A). The sign of the rate of change of voltage at the first node N1 will change during ramp down of the test current Itest relative to ramp up, but the magnitude of the rate of change will be the same during ramp up and ramp down of the test current Rest. In contrast, with a capacitive load connected as the load 702, the rate of change of voltage at the first node N1 will vary (as shown, for example, in FIG. 8B).

As such, by sampling the voltage at the first node N1 over time, a determination can be made as to whether the load 702 is purely resistive or capacitive. Moreover, using this method, a result can be ascertained during the ramp up of test current Itest in the test cycle. An early indication of the nature of the load 702 may be advantageous since it can be used to make decisions as to how to treat the load 702 during the remainder of the test cycle. For example, the detrimental effect of clamping a capacitive load may be mitigated by implementing one or more discharging regimes towards and/or at the end of a test cycle. Additionally, the rate of change of voltage at the first node N1 can be used to estimate both the resistance and capacitance of load 702.

Figure 9:
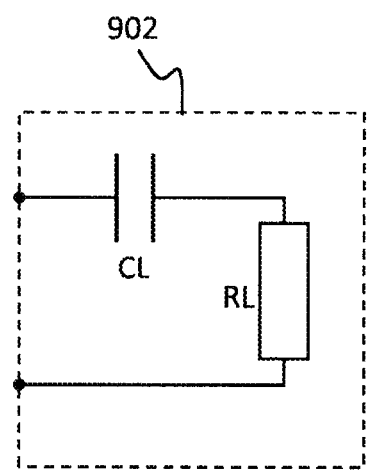
FIG. 9 is an example equivalent circuit for a capacitive load.

Various methods of estimating capacitance of a load 902, such as the loads 502, 602, 702 will now be described with reference to FIG. 9.

The load 902 comprises a capacitance CL and a resistance RL which are in series. It will thus be appreciated that changes in resistance RL of the load 902 will affect how much charge can accumulate on the capacitance CL of the load 902. The capacitance CL and resistance RL form a high pass filter. Where the load 902 is an active headset, the capacitance CL is typically less than around 220 uF and the resistance is typically in the 1 kΩ range. For a capacitance of around 220 uF and a resistance R of around 1 kΩ, the cut-off frequency of the high pass filter formed by the load 902 is around 0.3 Hz.

To estimate the capacitance of the load 502 in the detection circuit 500 shown in FIG. 5 using the second comparator 512, during a test cycle ramp down of the DAC code, the control module 510 may monitor the time elapsed between issuing a predetermined DAC code and the second comparator 512 toggling low. The predetermined DAC code may be zero or may be another DAC code. The time elapsed between the predetermined DAC code and the toggling of the second comparator 512 low will be approximately proportional to the capacitance of the load 502.

In more detail, the voltage at the first node N1 may be defined as:

$$v(t) = v_{init} \times e^{\frac{-t}{\tau}}$$

Where t is the discharge time since a predetermined DAC code (e.g. zero), and τ is the RC time constant formed by the capacitor CL and the discharge path (e.g. through the resistor string 106), assuming the resistance is constant during the discharge time.

At the trip point of the second comparator 512, v(t) is equal to Vref2 and the discharge time t is known. The start point of the discharge of the capacitance CL of the load 502 ($v_{init}$) is not known. However, it is assumed that $v_{init}$ is constant. The above equation may be rewritten as follows.

$$\frac{v(t)}{v_{init}} = e^{\frac{-t}{\tau}}$$

$$\ln\left(\frac{v(t)}{v_{init}}\right) = \frac{-t}{\tau}$$

-continued $$\tau = \frac{-t}{\ln\left(\frac{v(t)}{v_{init}}\right)}$$

Assuming $v_{init}$ and $v(t)$ are constant, the term $-\ln\left(\frac{v(t)}{v_{init}}\right)$ can be replaced by a constant, m, such that:

$$\tau = m \times t$$

The resistance R of the discharge path is made up of the resistance RL of the load 502 and the resistance of the resistor string 106 coupled between the load 502 and ground. The resistance RL of the load is application specific. For example, as mentioned above, the resistance RL of an active headset is typically around 1 k ohm. As such, the resistance R can be approximated from the known resistance of the resistor string 106 and the expected resistance RL of the load 502. The resistance R can thus be used to estimate the capacitance CL of the load:

$$CL = \frac{\tau}{R}$$

In the above example, the expected range or value of the resistance RL of the load 502 is used to approximate the total resistance R of the discharge path. In other examples, the above described measurement during a test cycle ramp down of the DAC code may be repeated with a different resistance in the resistor string 106. Simultaneous equations for the load capacitance CL (as shown above) for known different values of the resistance of the resistor string 106 and the unknown value of the load resistance RL may then be solved to resolve the unknown value of the load resistance RL.

To estimate the capacitance CL of the load 702 in the detection circuit 700 of FIG. 7 using the ADC 704, the following equation may be used to estimate the voltage v(t) at time t.

$$v(t) = \frac{1}{C}\int_{t0}^{\tau} Itest(\tau)d\tau + v(t0)$$

Where Itest is the test current, v(t0) is the starting voltage, t0 is the start time. Rearranging the above equation:

$$CL = \int_{t0}^{\tau} \frac{I(\tau)d\tau}{v(t) - v(t0)}$$

Since the voltage v, the starting voltage v(t0) and the test current Itest are all known, the capacitance CL can be estimated from the above equation. The above integral may be implemented by the control module 710 in logic. Additionally or alternatively, the control module 710 may use a lookup table either to determine the integral or to determine the division $$\frac{I(\tau)d\tau}{v(t) - v(t0)}.$$

It will be appreciated that the test current Itest may not be exactly equal to the current through the capacitance of the load 702 due to the presence of the discharge capacitor RD. To improve the accuracy of the estimation of capacitance C, the control module 710 may measure the voltage across at the discharge resistor RD to determine the current flowing through it and then subtract this current from the test current Itest to obtain the current through the capacitance of the load 702.

The capacitance of the load 702 may also be estimated by the detection circuit 700 by determining the rate of change (dVN1/dT) of the voltage VN1 at the first node N1 at two different times. For example, the control module 710 may capture multiple dVN1/dT samples over a test cycle. To reduce the effect of noise and/or outliers the control module 710 may use the Nth largest dVN1/dT sample and the Nth smallest dVN1/dT sample, for example, the $3^{rd}$ largest and $3^{rd}$ smallest dVN1/dT samples. The difference between the two chosen samples may then be determined. If the difference is zero, then the rate of change of the voltage VN1 at the first node N1 is zero and the load 702 is resistive only. Otherwise, the load 702 is capacitive. The change in rate of change may then be used to determine the capacitance of the load 702.

It will be appreciated that the behaviour of the voltage at the first node N1 changes in different phases of the test cycle (ramp up, hold, ramp down and discharge). As such, the control module 710 is preferably configured to select dVN1/dT samples collected during one of the phases of the test cycle for use in each estimation. In other words, dVN1/dT samples taken during different phases of a test cycle should not be used together to estimate capacitance and/or resistance of the load 702.

Exemplary methods of discharging the loads 502, 602, 702 will now be described with reference to FIGS. 10 to 13. In the following examples, the detection circuit 500 is shown. It will be appreciated that the methods described may equally be implemented in respect of each of the detection circuits 600, 700 shown in FIGS. 6 and 7.

Figure 10:
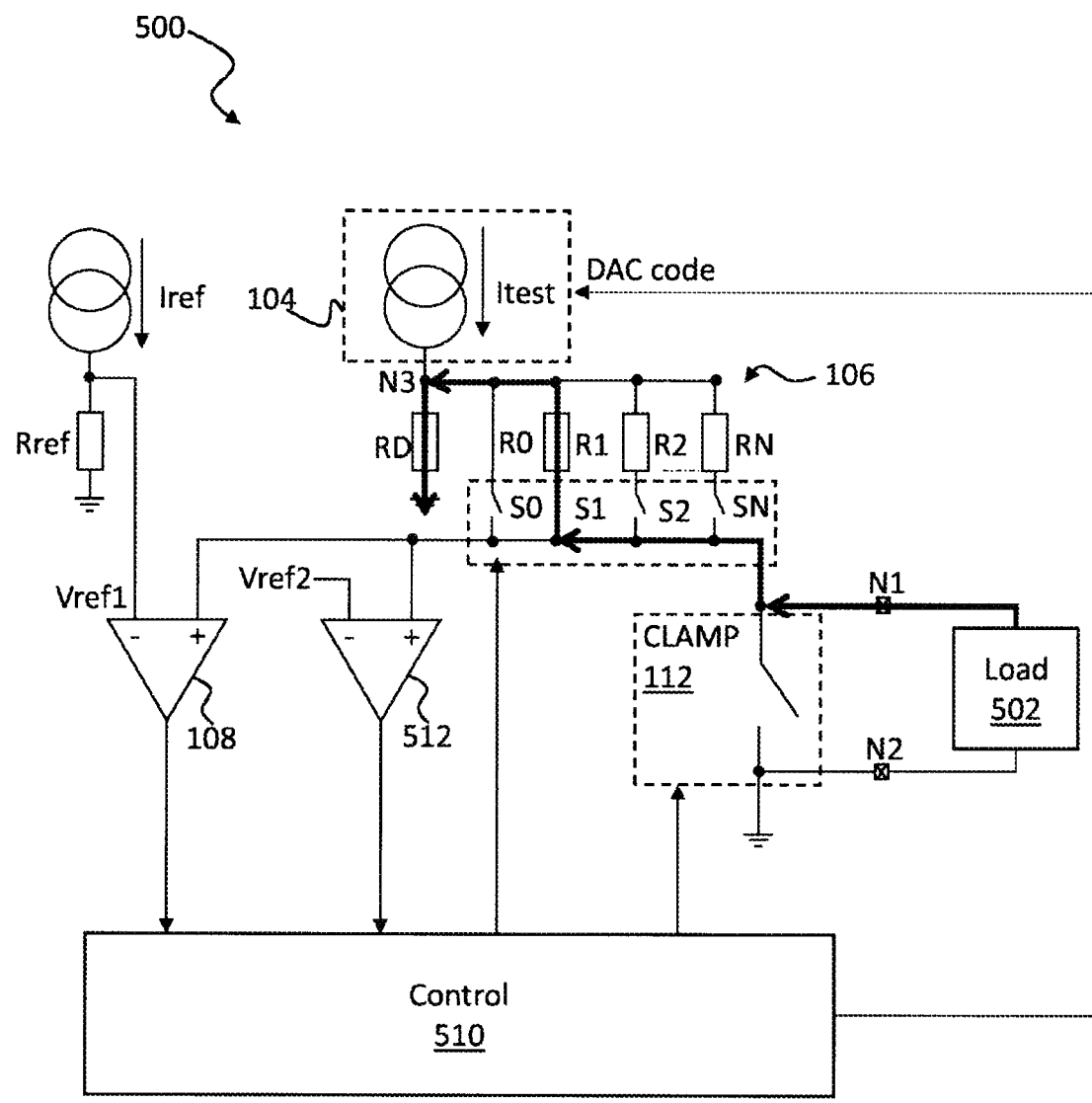
FIG. 10 is a schematic diagram of a discharge path through the detection circuit of FIG. 5.

FIG. 10 illustrates a discharge path (denoted by thick black arrows) from the first node N1 through the resistor string 106 and the discharge resistor RD. In this embodiment, the control module 510 may switch in one or more of the resistors R0:RN during a discharge phase of the test cycle and before the clamp 112 is enabled. The control module 510 may control the switches S0:SN to step down the resistance of the discharge path as the charge on the load 502 (and therefore the voltage at the first node N1) reduces. The control module 510 may maintain the switches in a discharge state until the point at which (or optionally a predetermined time after) the output of the second comparator 512 has gone low. The control module 610 of the detection circuit 600 may operate in a similar manner. The control module 710 of the detection circuit 700 may operate similarly by sampling the voltage at the first node N1 and maintaining the switches S0:SN in the discharge state until the voltage at the first node N1 drops below a threshold.

This discharge method has the advantage of not requiring additional circuitry. However, the discharge path is relatively long and its resistance cannot be reduced below the resistance of the discharge resistor RD. Accordingly, the time taken for the load 502 to discharge may be prohibitively long for some applications.

Figure 11:
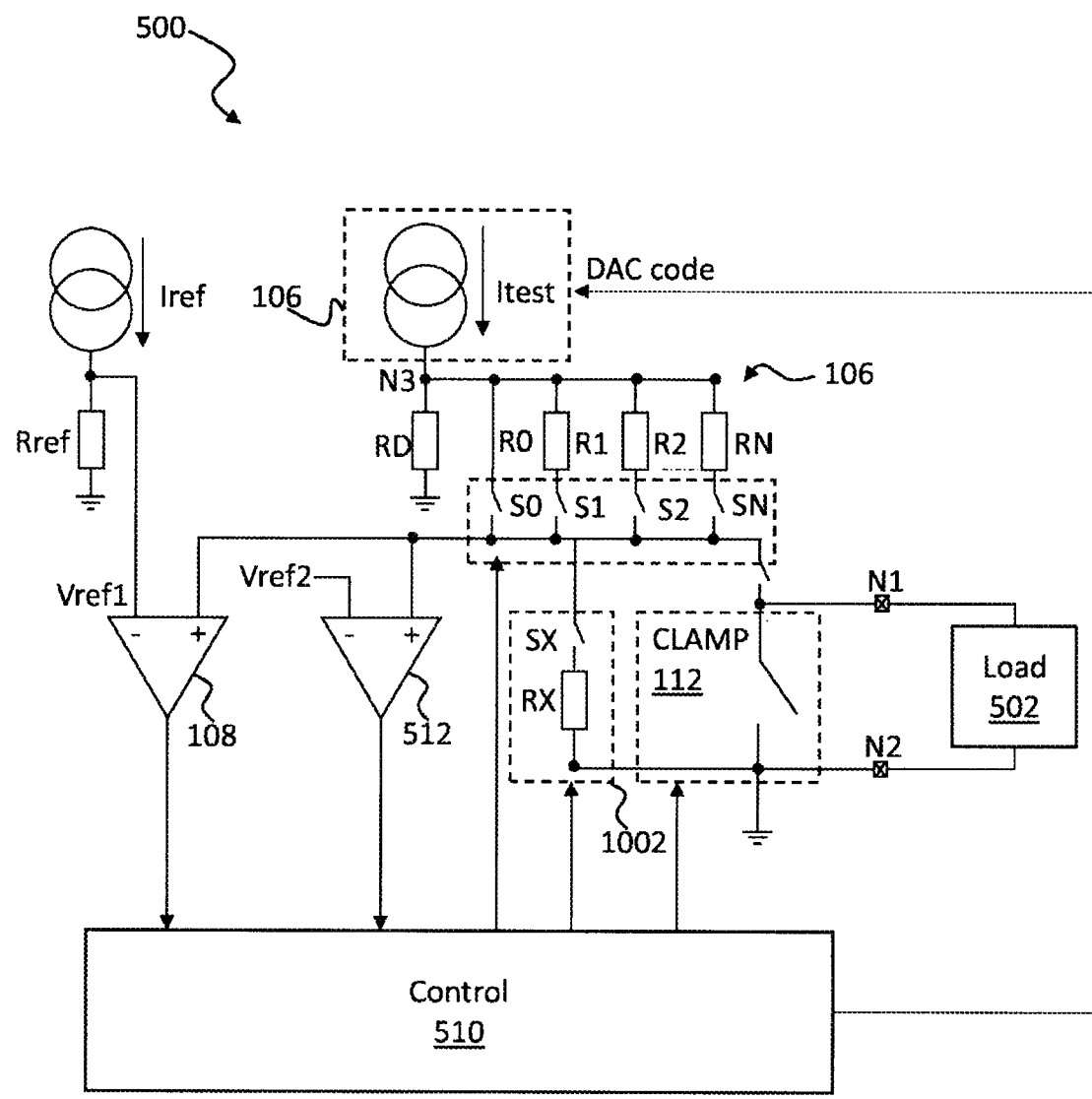
FIG. 11 is a schematic diagram of a load impedance detection circuit according to embodiments of the present disclosure.

FIG. 11 illustrates an alternative solution in which the detection circuit 500 has been modified with the addition of a discharge resistance path 1002 between the first node N1 and ground. The discharge resistance path 1002 comprises a resistance RX which is switchably connected to the first node N1 (or alternatively ground) by a switch SX. The resistance RX may be variable. The switch SX and the resistance RX (if variable) is controlled by the control module 510.

Figure 12:
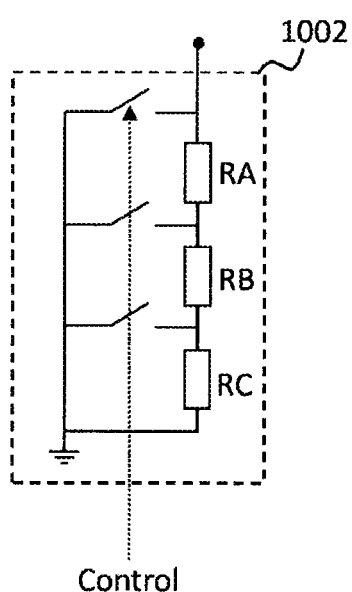
FIG. 12 is a schematic diagram of an exemplary discharge resistance path of the detection circuit of FIG. 11.

The discharge resistance path 1002 may comprise a resistor string as shown in FIG. 12 comprising a plurality of resistors RA, RB, RC (in this case three but any number of resistors may be provided), each resistor switchable coupled between the first node N1 and ground. During the discharge phase of a test cycle, the switches may be controlled so as to gradually reduce the resistance of the discharge resistance path 1002. In doing so, the time taken to discharge the capacitance of the load 502 is reduced. However, determining the capacitance of the load during the discharge phase with a time-varying discharge path resistance (for example using the second comparator 512) may be more difficult when compared to a constant discharge path resistance.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog (RTM) or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for detecting whether an audio headset comprises a capacitive load, the headset coupled between a first node and a second node of the circuitry, the circuitry comprising:
   drive circuitry for applying a first voltage to the first node over a first time period;
   processing circuitry configured to:
      measure a second voltage at the first node; and
      determine that the headset comprises the capacitive load based on the second voltage.

2. Circuitry of claim 1, wherein the processing circuitry is configured to:
   after the first time period, measure the second voltage by comparing the second voltage to a first reference voltage; and
   determine that the headset comprises the capacitive load if the second voltage is greater than the first reference voltage.

3. Circuitry of claim 2, wherein the processing circuitry is configured to:
   determine a time at which the second voltage is lower than the first reference voltage;
   determine a time delay between the end of the first time period and the time at which the second voltage is lower than the first reference voltage; and
   determine a capacitance of the capacitive load based on the time delay.

4. Circuitry of claim 1, wherein the processing circuitry is configured to:
   determine that the headset comprises the capacitive load if the second voltage exceeds a peak amplitude of the first voltage.

5. Circuitry of claim 1, wherein the processing circuitry is configured to:
   measure a change in the second voltage; and
   determine that the headset comprises the capacitive load based on the measured change in the second voltage.

6. Circuitry of claim 5, wherein the drive circuitry is configured to ramp up the first voltage during the first time period, wherein the change in the second voltage is measured during the first time period.

7. Circuitry of claim 6, wherein the drive circuitry is configured to:
   ramp up the first voltage during the first time period; and
   hold the first voltage constant during a second time period.

8. Circuitry of claim 7, wherein the processing circuitry is configured to measure the change in the second voltage during the second time period.

9. Circuitry of claim 7, wherein:
   the drive circuitry is configured to ramp down the first voltage during a third time period after the second time period; and
   the processing circuitry is configured to measure the change in the second voltage during the third time period.

10. Circuitry of claim 5, wherein the processing circuitry is configured to:
    determine that the headset comprises the capacitive load if the measured change in the second voltage is non-linear.

11. Circuitry of claim 5, wherein the processing circuitry is configured to:
    determine a capacitance of the capacitive load based on the measured change in the second voltage.

12. Circuitry of claim 11, wherein the processing circuitry is configured to:
    determine the capacitance of the capacitive load based on a measured rate of change in the second voltage.

13. Circuitry of claim 1, further comprising:
    a first impedance path selectively coupled between the first and second nodes; and
    a second impedance path selectively coupled between the first and second nodes the second impedance path having a higher impedance than the first impedance path;
    wherein the processing circuitry is configured to:
       couple the second impedance path between the first and second nodes if it is determined that the headset comprises the capacitive load.

14. Circuitry of claim 13, wherein the processing circuitry is configured to:
    couple the first impedance path between the first and second nodes if it is determined that the headset does not comprise the capacitive load.

15. Circuitry of claim 13, further comprising a digital-to-analogue converter (DAC), wherein the second impedance path passes through the DAC.

16. Circuitry of claim 13, further comprising a variable resistance, wherein the second impedance path passes through the variable resistance.

17. Circuitry of claim 16, wherein the processing circuitry is configured to:
    control the variable resistance to reduce the resistance of the second impedance path after coupling the second impedance path between the first and second nodes.

18. Circuitry of claim 16, wherein the variable resistance comprises a switchable resistor string.

19. Circuitry of claim 13, wherein the first impedance path comprises a switch.

20. Circuitry of claim 1, wherein the capacitive load comprises an active load.

21. An electronic device comprising circuitry according to claim 1.

22. The electronic device of claim 21, wherein the device comprises one of a mobile computing device, a laptop computer, a tablet computer, a games console, a remote control device, a home automation controller or a domestic appliance, a toy, a robot, an audio player, a video player, or a mobile telephone, and a smartphone.

23. A non-transitory machine-readable medium storing instructions which, when executed by processing circuitry, cause an electronic apparatus to implement a method of detecting whether an audio headset comprises a capacitive load, the headset coupled between a first node and a second node, the method comprising:
    applying a first voltage to the first node over a first time period;
    measuring a second voltage at the first node; and
    determining that the headset comprises the capacitive load based on the second voltage.

24. A method of detecting whether an audio headset comprises a capacitive load, the headset coupled between a first node and a second node, the method comprising:
    applying a first voltage to the first node over a first time period;
    measuring a second voltage at the first node; and determining that the headset comprises the capacitive load based on the second voltage.

\* \* \* \* \*